United States Patent [19]

Frusco

[11] 4,137,546

[45] Jan. 30, 1979

[54] STAMPED LEAD FRAME FOR SEMICONDUCTOR PACKAGES

[75] Inventor: John M. Frusco, Scotch Plains, N.J.

[73] Assignee: Plessey Incorporated, Montvale, N.J.

[21] Appl. No.: 842,322

[22] Filed: Oct. 14, 1977

[51] Int. Cl.² ............... H01L 23/48; H01L 29/44; H01L 29/52

[52] U.S. Cl. .................... 357/70; 357/68; 357/74; 357/80; 29/588

[58] Field of Search .............. 357/68, 70, 74, 80; 29/588

[56] References Cited

U.S. PATENT DOCUMENTS

| | | | |
|---|---|---|---|
| 3,404,319 | 10/1968 | Tsusi et al. | 357/70 |
| 3,665,256 | 5/1972 | Goun et al. | 357/70 |
| 3,685,137 | 8/1972 | Gardiner | 357/70 |
| 3,751,724 | 8/1973 | McGrath et al. | 357/70 |
| 3,783,346 | 1/1974 | Schierz | 357/70 |
| 3,930,114 | 12/1975 | Hodge | 357/70 |
| 3,986,334 | 10/1976 | Harper | 357/70 |
| 3,986,335 | 10/1976 | Harper | 357/70 |
| 4,065,625 | 12/1977 | Iwai et al. | 357/70 |
| 4,084,312 | 4/1978 | Kirk et al. | 357/70 |

FOREIGN PATENT DOCUMENTS 1429358  3/1976  United Kingdom ............ 357/70

*Primary Examiner*—Andrew J. James
*Attorney, Agent, or Firm*—James J. Burke

[57] ABSTRACT

A stamped, 40-lead ceramic dual-in-line package (CerDip) frame is disclosed. Increased usage and lowered costs of large scale, integrated circuits (LSI) for microprocessor and similar applications has created a demand for precision ceramic packaging of the forty-lead dual-in-line type that is adapted for automated chip insertion in high-volume and at a low cost. The present invention meets this need with a stamped lead frame wherein the longest and most fragile leads are held in precise spatial relation by means of break-off tabs. After embedment of the leads on the ceramic substrate with a glass composition, the tabs are broken and removed. Forming, scoring and bending of the tabs are carried out as an integral part of the progressive stamping operation. Lead frames according to the invention replace much more expensive etched parts. The invention may be applied in a variety of packages.

10 Claims, 7 Drawing Figures

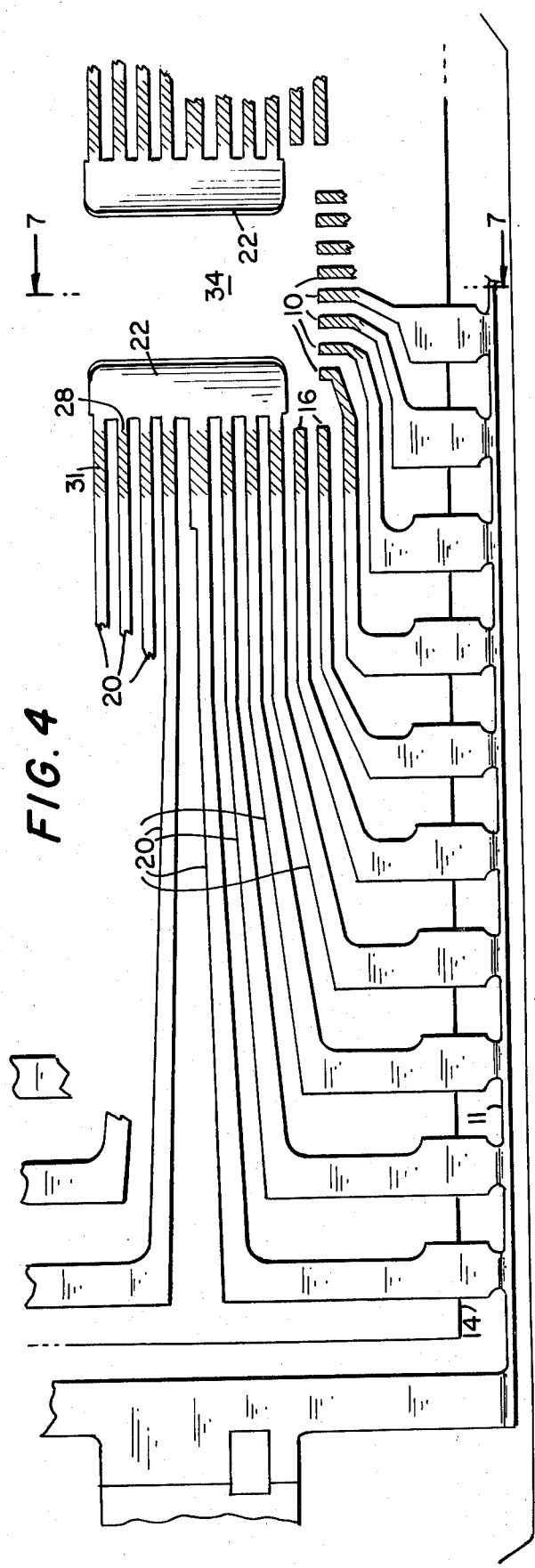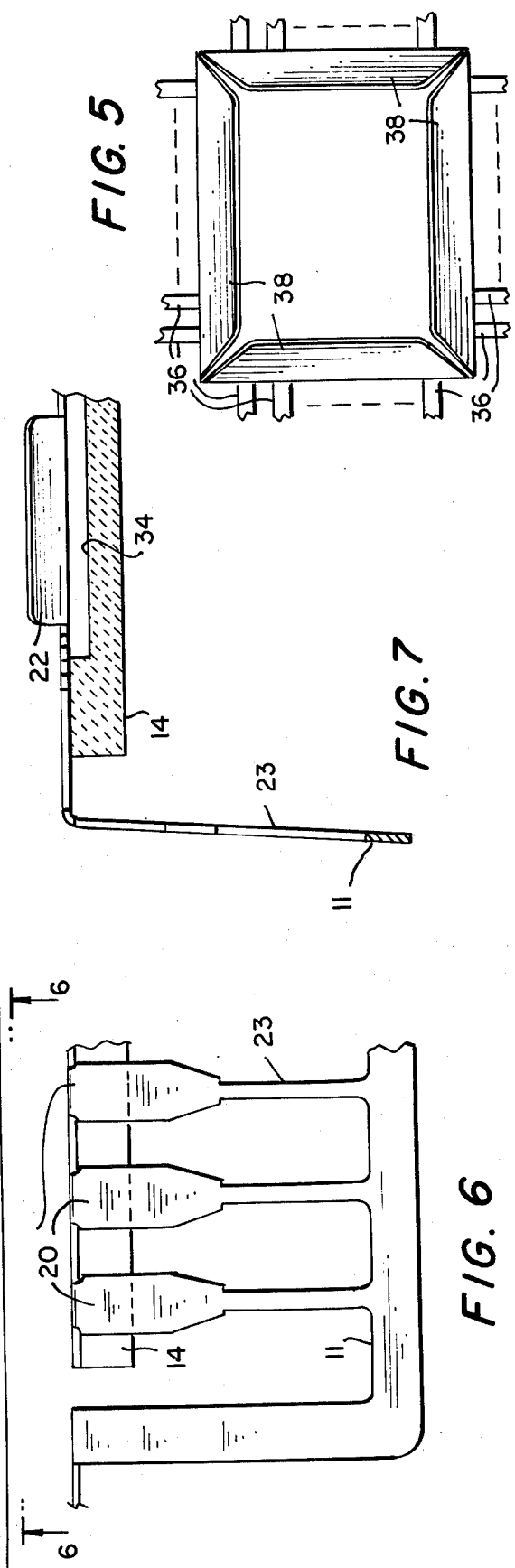

STAMPED LEAD FRAME FOR SEMICONDUCTOR PACKAGES

BACKGROUND OF THE INVENTION

The present invention relates in general to packages for semiconductive devices. More particularly, the invention relates to semiconductor packages that include stamped or etched metal lead frames. The invention is specifically adapted to, and will described in connection with, a 40-lead dual-in-line ceramic package, or Cer-Dip, but it is not so limited; the invention can, in fact, be applied to substantially any lead frame used in ceramic packages.

Ceramic packages have three essential parts. A ceramic substrate has a central cavity or depression that is metallized and plated to receive the semiconductive device or "chip". In Dip packages, the substrate is rectangular, and in "quad" packages, the substrate is square. The lead frame is secured to the upper surface of the substrate and includes a plurality of metal leads extending from the edge of the cavity to and beyond edges of the substrate. In Dip packages, the leads extend to the two long sides of the rectangular substrate and are there bent down to form two parallel lines of leads that are adapted for insertion into printed circuit boards. In quad packages, the leads extend over the edges on all four sides. Lastly, and after the chip has been bonded in the depression and wired to the leads, a ceramic cover is secured over the top to hermetically seal the chip.

During manufacture, the outer ends of the leads are all integral with a surrounding frame which holds them in place (hence the name "lead frame") and there may also be intermediate tie-bars between the leads assisting in the same function. At some point after the lead frame is secured to the substrate, the frame and tie bars are cut away.

Lead frames are made by either stamping or etching. Etching is a relatively slow process, but it is advantageous in that required photomasks are not expensive. Etching is thus preferred for low-volume production, particularly where complicated patterns are involved. Stamping is very rapid, but requires a very substantial investment in tooling, because as many as 15 progressive steps may be involved. Stamping is thus preferred for high volume production.

Lead frames are manufactured out of so-called glass-sealing alloys, which are alloys specifically designed to have a coefficient of thermal expansion about the same as the glass they will ultimately be embedded in. Kovar (trademark) is one such alloy and contains iron, cobalt and nickel. Alloy 42 is similar. Kovar is preferred for etched frames and Alloy 42 is preferred for stamping. These alloys are difficult to bond wires directly to. Accordingly, the alloy may be provided with a stripe of vapor-deposited aluminum which covers the lead tips, or a dot of gold may be applied over the lead tips by selective plating.

The progress of microelectronics has been miniaturization, putting more and more electronic functions on a single chip. Whereas a few years ago, a 14-lead Dip was practically standard, today 40 and even 64-lead packages are commonplace. The chip itself and the cavity in the substrate have remained about the same size (roughly ¼ in. square), however, so the leads have had to become progressively finer and be more closely spaced. In a 40 lead package, for example, the leads (at the tip) may be 0.012 in. wide and spaced 0.012 in. apart. Because no tie bars can be placed on the portions of the leads to be embedded in the glass, the very fine leads can move about, particularly during the embedding operation, and one short circuit — e.g. two leads touching, will ruin the entire package.

Accurate lead positioning is even more important — in fact it is absolutely essential — when automatic equipment is used to insert and wire bond the chip.

One solution to this problem is to extend the lead tips over the edge of the cavity, and have them connected by an internal tie-bar. A multi-layer ceramic package is then used; the lead frame is embedded on the surface of a substrate having a hole instead of a cavity. A punch and die then trim off the internal tie-bar. A second substrate, including the gold-die-attach pad forming the bottom of the cavity, is then secured to the upper part.

While prior art relevant to the present invention, other than frames with internal tie-bars as noted above, is not known, certain patents are of interest. Thompson, U.S. Pat. No. 3,802,069 discloses a frame having a central pad held by two leads during manufacture to prevent pad misalignment, one lead being severed prior to encapsulation. Lincoln, U.S. Pat. No. 3,893,158 discloses a complex frame including both upwardly and downwardly offset portions, produced by cutting a frame in half and rotating one-half 180°. Frames for plastic Dip packages are disclosed in U.S. Pat. No. 3,629,668 of Hingorany, and include a bonding pad and supporting tie bar attached to, but of a material distinct from, the remainder of the frame.

OBJECTS OF THE INVENTION

A general object of the present invention is to provide an improved lead frame for semiconductor packages.

A further object of the present invention is to provide a lead frame including break-off tabs supporting at least the longest leads at their inner tips.

Another object of the present invention is to provide a stamped lead frame including smaller leads more closely spaced than has heretofore been possible.

A still further object of the present invention is to provide a complex lead frame including large numbers of closely spaced leads that can be manufactured in high volume and at a low cost with a high yield of acceptable parts.

Various other objects and advantages of the invention will become clear from the following discription of embodiments thereof, and the novel features will be particularly pointed out in connection with the appended claims.

THE DRAWINGS

Reference will hereinafter be made to the accompanying drawings, wherein:

FIG. 4 is a plan view greatly enlarged, of one-quarter of a completed 40-lead Dip lead frame in accordance with the invention;

FIG. 5 is a plan view of an alternate embodiment of the invention, wherein all leads are tab-supported; and FIGS. 6 and 7 are elevation views of the FIG. 4 lead frame, taken along lines 6—6 and 7—7 respectively.

DESCRIPTION OF EMBODIMENTS

The present invention is based, at least in part, on the discovery or determination that lead frames having very fine leads very closely spaced can not only be stamped, but also survive the embedment process, providing tabs are used to maintain at least the longest leads in precise spatial relation through embedment.

Figure 1:
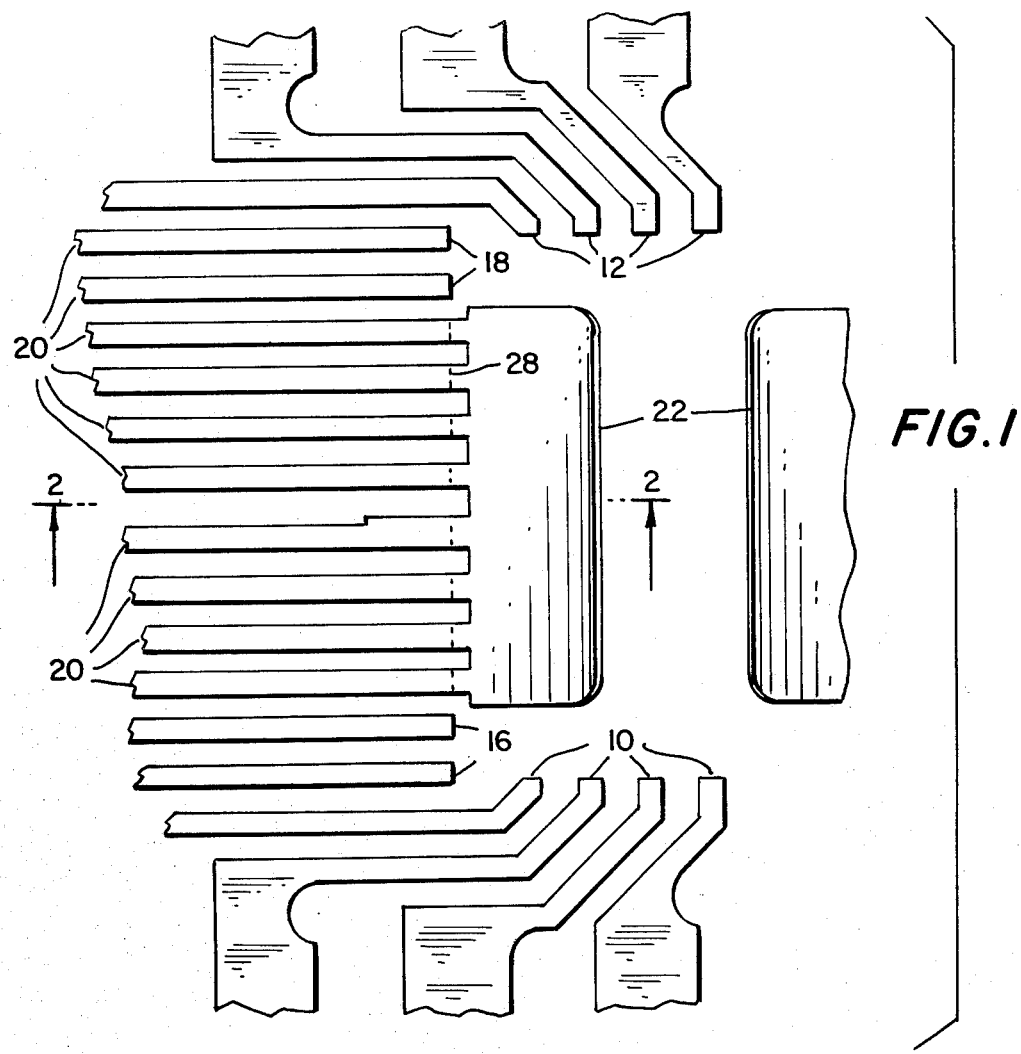
FIG. 1 is an enlarged, partial plan view of a small portion of a lead frame embodying the invention.

Stamping of complex lead frames is carried out in progressive carbide dies. That is, the raw material is fed through a stamping press having successive punch and die sets at a number of stations, where successive stamping operations are carried out. The material is indexed forward one station between each stamping blow. Typically, index holes are punched at the first station, and the various leads are formed at successive stations. FIG. 1 shows the tips of 20 leads of a 40-lead frame. The configuration shown results after ten stamping operations. FIG. 4 shows one-fourth of an entire device, including frame 11 integral with the outer ends of all leads.

As is more clearly shown in FIG. 4, leads 10, 12 are very short, and are bent over the side of ceramic substrate 14 a small distance from the tip, because their tips are parallel with the long side of the substrate. Furthermore, they are spaced relatively widely from each other. Even leads 16, 18, while longer than leads 10, 12 are not so long that motion or shorting is a problem, even though their tips are parallel to the short side of the substrate. Leads 20 are the longest, their unsupported length being such that they could not survive stamping, much less embedment, without internal support.

In accordance with the invention, then in the tenth operation, the metal holding all the lead tips is cut away except for the tabs 22 holding leads 20. At this point, however, tabs 22 are not distinct from internal tie bars found in the prior art.

At the next station the sides of the leads are bent down into two parallel rows 23, in FIG. 7 (Which is one reason Dip packages are preferred by the industry over other types: they can continue to be handled in automatic equipment after lead bending).

Figure 2:
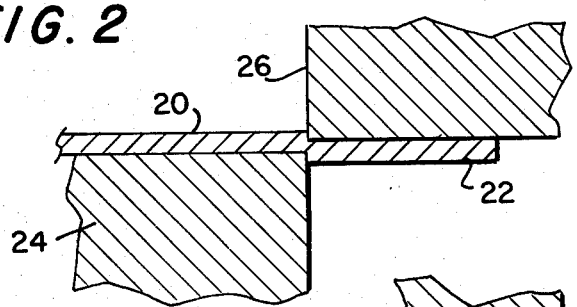
FIGS. 2 and 3 are cross sectional elevations, taken along line 2—2 of FIG. 1, and illustrating scoring and bending of tabs in accordance with the invention.

The next station is particularly important in the present invention, and attention is directed to FIG. 2. Leads 20 are here supported on a die 24, and a punch 26 scores tabs 22 about one-half way through its thickness. The score line is shown in phantom at 28 in FIG. 1.

Figure 3:
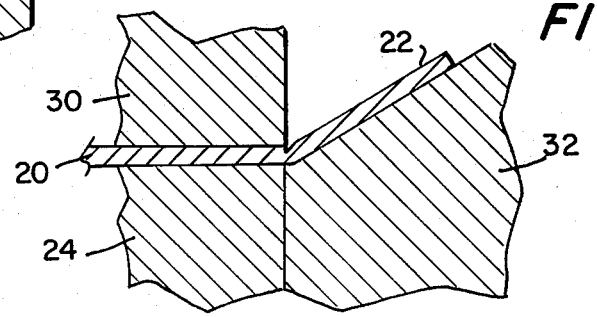

The next and final station in the stamping process is also novel and important to the present invention. In a conventional lead frame process, this stage involves coining the lead tips to insure flatness, and this is done in the present invention as well. More particularly, in moving from the scoring to the coining station, the bent strip is raised a few thousandths on springmounted supports. With reference to FIG. 3, a coining punch 30 then presses down, coining lead tips 20 (as well as tips of leads 10, 12, 16, 18) against die block 24 over the area 31 (FIG. 4). As coining punch 30 pushes the frame down (and the spring-mounted supports give way), tabs 22 impinge against a slope-sided die block 32, bending tabs 22 upward at a suitable angle, 30°–45°. When coining punch 30 retracts, the spring supports raise the frame over block 32, and the finished strip of frames moves on to cutting and stacking.

Processing from this point on is substantially conventional. Ceramic substrate 14 having central cavity 34 and a screen-printed glass coating is positional on a fixture so that the lead tips reach the edge of cavity 34 and tabs 22 extend thereover. The glass is a low-melting composition, and heat is quickly applied to melt same, while a ram (similar to coining die 30 but covering all of the horizontal leads) presses the leads into the glass and quickly cools the assembly. After the glass is solidified, tabs 22, having served their function during the embedment process are broken off, leaving lead tips 20 exposed and in precise spatial relation.

It will be appreciated that while the invention is particularly adapted for stamped lead frames, it could be embodied in an etched part. More particularly, such a part would include tabs 22, and they would thereafter be scored and bent as described above but on a separate machine.

Other variations are possible, and one is illustrated in FIG. 5: In quad packages or very large packages, it may be desireable to support all leads 36, in which case the stamping (or etching) leaves four tabs 38, which can be scored and bent in precisely the same manner as described hereinabove in connection with tabs 22.

Various other changes in the details, steps, materials, and arrangements of parts, which have been herein described and illustrated to explain the nature of the invention, may be made by those skilled in the art, within the principle and scope of the invention as defined in the appended claims.

What is claimed is:

1. In a lead frame for semiconductor packages including a plurality of leads integral with a surrounding frame and extending to a central opening around which the inner tips of said leads converge, the improvements comprising:
   the inner tips of at least the longest of said leads being integral with one or more tabs;
   said tabs being scored across a break-off line to facilitate removal of same.

2. The lead frame as claimed in claim 1, and additionally comprising said tabs being upwardly-bent along the score line at a suitable angle to further facilitate removal of same.

3. The lead frame as claimed in claim 1, wherein said package is a rectangular dual-in-line package, said opening is substantially square, and said tabs are integral with the longest leads having their tips parallel to the short side of said rectangle.

4. The lead frame as claimed in claim 3, and additionally comprising:
   a rectangular ceramic substrate including a cavity on its upper surface corresponding to said opening;
   said substrate underlying said lead frame with said inner tips converging on said cavity and the outer ends of said leads, and said frame, extending beyond the edges of said substrate; and
   a layer of glass on said upper surface having overlying portions of said leads embedded therein.

5. The lead frame as claimed in claim 1, wherein said opening is substantially square, there are four of said tabs, each integral with leads on one side of said opening, and each said tab is upwardly-bent at a suitable angle to further facilitate removal of same.

6. The lead frame as claimed in claim 2, wherein said score line extends across the inner tips of said leads and into same to approximately one-half their thickness.

7. A stamped lead frame for a dual-in-line semiconductor package comprising:
   a rectangular ring having a plurality of leads integral with the long sides thereof extending interiorly from said ring and converging at their inner tips on a substantially square central opening;

at least the longest of said leads on the sides of said opening having inner tips parallel to the short sides of said rectangle being integral with break-off tabs interior of said central opening;

said inner tips integral with said tabs being scored along a score line to facilitate removal of said tabs.

8. The lead frame as claimed in claim 7, and additionally comprising said tabs being upwardly bent at a suitable angle along said score line, to further facilitate removal of same.

9. The stamped lead frame as claimed in claim 7, and including at least 40 of said leads.

10. A partially-assembled dual-in-line semiconductor package comprising:

the stamped lead frame as claimed in claim 7;

a rectangular ceramic substrate having a central cavity corresponding to said opening and a glass layer on the remainder of the upper surface thereof;

said leads being embedded in said glass layer over the upper surface and extending beyond the edges of the long sides of said substrate;

said extending leads being bent downwardly in a dual-in-line configuration.

* * * * *